US008748254B2

(12) United States Patent
Lee et al.

(10) Patent No.: US 8,748,254 B2
(45) Date of Patent: Jun. 10, 2014

(54) METHOD OF MANUFACTURING SEMICONDUCTOR DEVICE

(75) Inventors: Kwang-wook Lee, Seongnam-Si (KR); Sang-jun Lee, Seoul (KR); In-seak Hwang, Suwon-si (KR); In-sang Jeon, Seoul (KR); Byoung-yong Gwak, Suwon-si (KR); Ho-kyun An, Seoul (KR)

(73) Assignee: Samsung Electronics Co., Ltd. (KR)

( * ) Notice: Subject to any disclaimer, the term of this patent is extended or adjusted under 35 U.S.C. 154(b) by 220 days.

(21) Appl. No.: 13/494,328

(22) Filed: Jun. 12, 2012

(65) Prior Publication Data

US 2013/0052787 A1 Feb. 28, 2013

(30) Foreign Application Priority Data

Aug. 23, 2011 (KR) ........................ 10-2011-0084063

(51) Int. Cl.
*H01L 21/00* (2006.01)
(52) U.S. Cl.
USPC .................... 438/233; 438/257; 257/E27.085
(58) Field of Classification Search
None
See application file for complete search history.

(56) References Cited

U.S. PATENT DOCUMENTS

| 6,165,840 | A  | * | 12/2000 | Choi et al. | 438/253 |
|---|---|---|---|---|---|
| 6,537,874 | B2 | * | 3/2003 | Nakamura et al. | 438/253 |
| 6,821,846 | B2 | * | 11/2004 | Shao et al. | 438/253 |
| 7,936,563 | B2 | * | 5/2011 | Gosset et al. | 361/689 |
| 2003/0089954 | A1 | * | 5/2003 | Sashida | 257/369 |
| 2003/0109124 | A1 | * | 6/2003 | Nakamura et al. | 438/597 |
| 2008/0224194 | A1 | * | 9/2008 | Sashida | 257/295 |
| 2009/0130842 | A1 | * | 5/2009 | Hwang et al. | 438/637 |
| 2014/0017863 | A1 | * | 1/2014 | Lee et al. | 438/238 |

FOREIGN PATENT DOCUMENTS

| KR | 1020030055789 | 7/2003 |
|---|---|---|
| KR | 1020080058006 | 6/2008 |
| KR | 1020090001137 | 1/2009 |

\* cited by examiner

*Primary Examiner* — Seahvosh Nikmanesh
*Assistant Examiner* — Evren Seven
(74) *Attorney, Agent, or Firm* — Onello & Mello, LLP

(57) ABSTRACT

A method of manufacturing a semiconductor device includes forming a bit line on a substrate comprising an active region; forming an interlayer insulating layer covering the bit line on the substrate; forming a first hole at a location of the active region through the interlayer insulating layer; forming a dummy contact layer by filling the first hole; forming a mold layer on the interlayer insulating layer and the dummy contact layer; forming a second hole at a location of the dummy contact layer through the mold layer; removing the dummy contact layer in the first hole through the second hole; forming an epitaxial layer on a portion of the active region, which is exposed at a lower surface of the first hole; and forming a lower electrode on internal surfaces of the first hole and the second hole.

19 Claims, 16 Drawing Sheets

METHOD OF MANUFACTURING SEMICONDUCTOR DEVICE

CROSS-REFERENCE TO RELATED APPLICATIONS

This application claims the benefit of Korean Patent Application No. 10-2011-0084063, filed Aug. 23, 2011 in the Korean Intellectual Property Office, the content of which is incorporated herein in its entirety by reference.

BACKGROUND

The inventive concepts relate to a method of manufacturing a semiconductor memory device, and more particularly, to a method of manufacturing a semiconductor memory device including a capacitor.

Due to industrial and multimedia developments, semiconductor devices used in computers, mobile equipment, or the like are required to be highly integrated and have high performance. With regard to a semiconductor device including a capacitor, it is difficult to ensure the electrostatic capacity of the capacitor. Accordingly, there is a need to maintain or increase required electrostatic capacity while reducing an area of the semiconductor device.

SUMMARY

The inventive concepts provide a method of manufacturing a semiconductor device for obtaining a high integration density and improved performance and reliability.

According to an aspect of the inventive concept, there is provided a method of manufacturing a semiconductor device. The method includes forming a bit line on a substrate including an active region; forming an interlayer insulating layer covering the bit line on the substrate; forming a first hole at a location of the active region through the interlayer insulating layer; forming a dummy contact layer by filling the first hole; forming a mold layer on the interlayer insulating layer and the dummy contact layer; forming a second hole at a location of the dummy contact layer through the mold layer; removing the dummy contact layer in the first hole through the second hole; forming an epitaxial layer on a portion of the active region, which is exposed at a lower surface of the first hole; and forming a lower electrode on internal surfaces of the first hole and the second hole.

An upper surface of the epitaxial layer may be formed at a layer that is at a lower level than an upper surface of the bit line.

A lower surface of the lower electrode may be formed at a at a layer that is at a lower level than an upper surface of the bit line.

A width of the first hole may be greater than a width of the second hole at an interface between the first hole and the second hole.

The method may further include forming an ohmic contact layer including a silicide material on the epitaxial layer.

The epitaxial layer may be formed using a sequential epitaxial growth (SEG) method.

The epitaxial layer may be a silicon epitaxial layer having a thickness of 50 Å to 600 Å.

The method may further include, prior to the forming of the dummy contact layer, forming an etch stop layer on a portion of the active region, which is exposed by the first hole, wherein portions of the etch stop layer are removed after the dummy contact layer is removed.

The dummy contact layer may include polycrystalline silicon.

The dummy contact layer may be removed using a wet etching process using a solution including any one of $NH_4OH$, $KOH$, $NH_2OH$, and tetramethylammonium hydroxide (TMAH).

The method may further include removing the mold layer; and forming a dielectric layer and an upper electrode on the lower electrode, wherein the dielectric layer and the upper electrode are formed on a single lateral surface of the lower electrode only in the first hole and are formed on both lateral surfaces of the lower electrode in the second hole.

The method may further include forming a gate line that is buried in the substrate, crosses the active region, and extends in a direction perpendicular to the bit line.

According to another aspect of the inventive concept, there is provided a method of manufacturing a semiconductor device, the method including forming a bit line on a substrate including an active region; forming an interlayer insulating layer on an upper surface of the bit line on the substrate; forming a first hole at a location of the active region through the interlayer insulating layer; forming a dummy contact layer by filling the first hole; forming a mold layer on the interlayer insulating layer and the dummy contact layer; forming a second hole at a location of the dummy contact layer through the mold layer; removing the dummy contact layer in the first hole through the second hole; and forming a lower electrode on internal surfaces of the first hole and second hole.

The lower electrode may include a bent portion that is formed due to a difference in widths of the first hole and second hole at an interface therebetween.

An epitaxial layer may be formed on a portion of the active region, wherein an upper surface of the epitaxial layer may be formed at a layer that is at a lower level than an upper surface of the bit line.

According to another aspect of the inventive concepts, there is provided a semiconductor device including a substrate including an active region defined by a device isolation layer; an interlayer insulating layer formed on the substrate and having a predetermined height; and a capacitor including a cylindrical lower electrode that is formed on the substrate through the interlayer insulating layer from the active region and extends in a perpendicular direction to the substrate, a dielectric layer surrounding lower electrode, and an upper electrode formed on the dielectric layer and filling a space between adjacent lower electrodes, wherein the lower electrode includes a bent portion that is formed due to a difference in widths around an upper surface of the interlayer insulating layer.

An epitaxial layer may be formed between the lower electrode and the active region.

According to another aspect of the inventive concepts, there is provided a method of manufacturing a semiconductor device, comprising forming an active region in a substrate; forming a bit line on the substrate having the active region; forming an interlayer insulating layer on the substrate; forming a capacitor hole in the interlayer insulating layer to the active region; forming at least one of the epitaxial layer and an ohmic contact layer in the capacitor hole on the active region; and forming an electrode on sidewalls of the capacitor hole and on the ohmic contact layer.

Forming the capacitor hole may include forming a first hole in the interlayer insulating layer to the active region; filling the first hole with a dummy contact layer; forming a mold layer on the interlayer insulating layer and the dummy contact layer; forming a second hole in the mold layer to the dummy contact layer; and removing the dummy contact layer in the first hole through the second hole.

The lower electrode may comprise a bent portion that is formed due to a difference in widths of the first hole and second hole at an interface therebetween.

An upper surface of the epitaxial layer may be formed at a layer that is at a lower level than an upper surface of the bit line.

A lower surface of the lower electrode may be formed at a layer that is at a lower level than an upper surface of the bit line.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EMBODIMENTS

Figure 1:
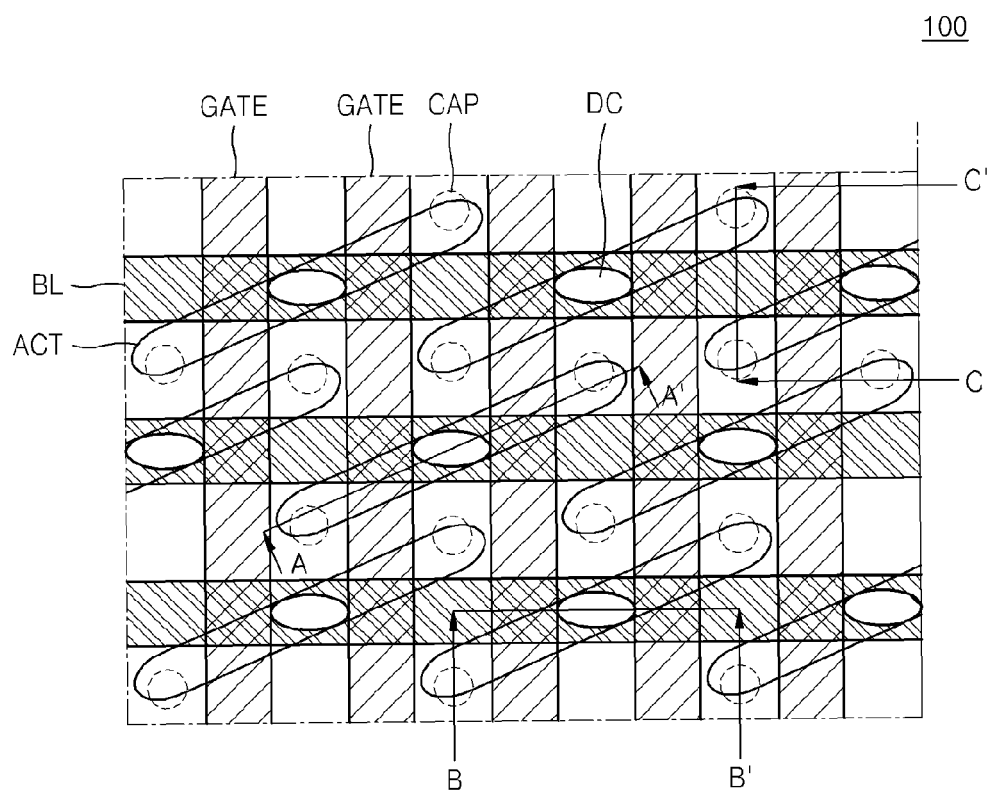
FIG. 1 is a schematic layout of a semiconductor device according to an embodiment of the inventive concepts.
Figure 1:
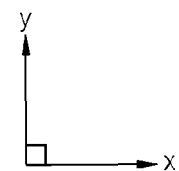

The inventive concepts will now be described more fully with reference to the accompanying drawings, in which exemplary embodiments of the inventive concepts are shown. The inventive concepts can, however, be embodied in many different forms and should not be construed as being limited to the embodiments set forth herein; rather, these embodiments are provided so that this disclosure will be thorough and complete, and will fully convey the concept of the invention to those of ordinary skill in the art.

As such, variations from the shapes of the illustrations as a result, for example, of manufacturing techniques and/or tolerances, are to be expected. Thus, embodiments of the inventive concepts should not be construed as limited to the particular shapes of regions illustrated herein but are to include deviations in shapes that result, for example, from manufacturing. In diagrams, like reference numerals in the drawings denote like elements. In addition, various elements and regions are schematically shown in diagrams. Thus, the inventive concept is not limited to relative sizes and intervals shown in diagrams. As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic layout of a semiconductor device 100 according to an embodiment of the inventive concept.

Some or all of the structure of the semiconductor device 100 of FIG. 1 may be applied to, for example, a cell array region of a dynamic random access memory (DRAM). However, the inventive concepts are not limited thereto.

Referring to FIG. 1, the semiconductor device 100 includes a plurality of active regions ACTs, a plurality of gate lines GATEs, and a plurality of bit lines BLs. The active regions ACTs can intersect the gate lines GATEs. Regions of the active regions ACTs that do not include the gate lines GATEs can be source or drain regions. One or more capacitors CAP may be formed at the source regions and may be electrically connected to the source regions. Direct contact plugs DCs may be formed at the drain regions for electrically connecting the drain regions and the bit lines BL.

The active regions ACT may be defined by a device isolation layer (not shown). As shown in FIG. 1, the active regions ACTs may be arranged to extend at predetermined angles with respect to the bit lines BLs and the gate lines GATEs.

The gate lines GATEs may be arranged across the active regions ACTs in one direction, for example, in a y-axis direction. For example, as shown in FIG. 1, two gate lines GATEs may cross a single active region ACT. In this case, a drain region may be formed between the two gate lines GATEs that cross the single active region ACT. Two source regions may be formed outside the two gate lines GATEs, respectively. The source regions and the drain regions may be formed by doping or ion-injecting substantially the same impurity, which may be reversed according to a circuit configuration of a final transistor.

The direct contact plugs DCs may be formed on the drain regions. The direct contact plugs DCs may electrically connect the drain regions to the bit lines BLs. According to the present embodiment, a single direct contact plug DC formed on a single active region ACT may apply a drain voltage to a transistor including gate lines GATEs adjacent to the single direct contact plug DC.

The bit lines BLs may extend in one direction perpendicular to the gate lines GATEs, for example, in an x-axis direction. According to another embodiment of the inventive concept, the bit lines BLs and the gate lines GATEs may cross each other at a predetermined angle.

The capacitors CAPs corresponding to a storage region may be formed on the source regions. The capacitors CAPs may be connected directly to the source region or may be connected to the source region through an epitaxial layer, described below in detail. According to an embodiment, the capacitors CAPs are arranged across boundaries of the active regions ACTs. However, the inventive concepts are not limited thereto. According to another embodiment of the inventive concept, the capacitors CAPs may be disposed on the active regions ACT only.

Figure 2A:
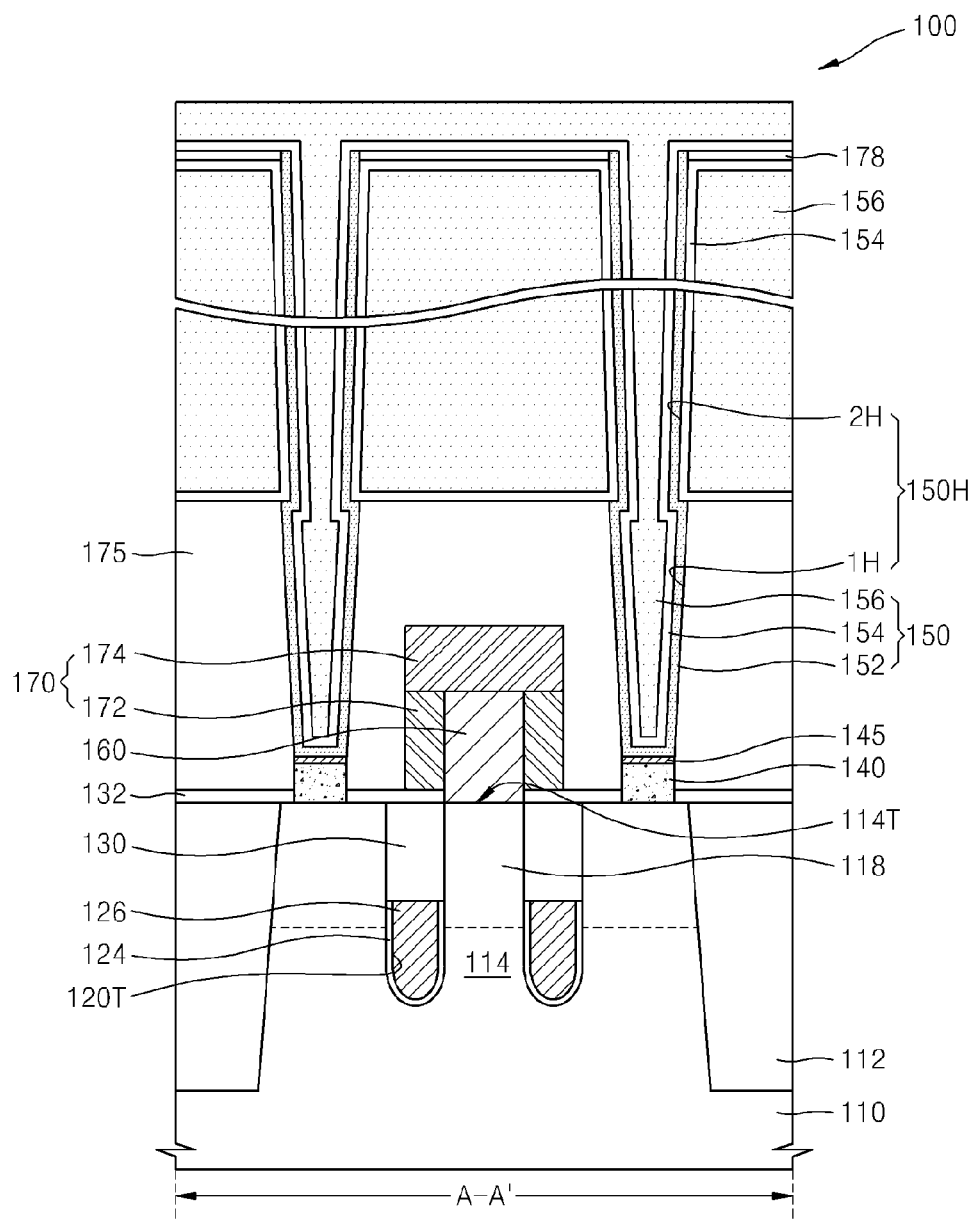
FIGS. 2A through 2C are cross-sectional views of the semiconductor device of FIG. 1.
Figure 2B:
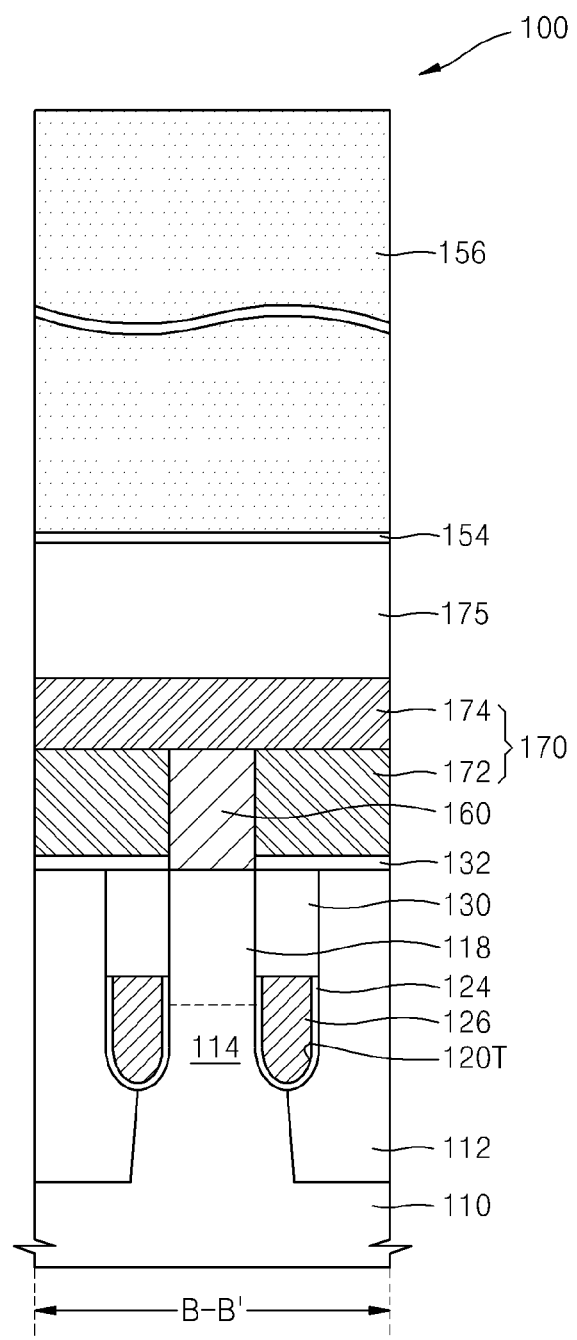
Figure 2C:
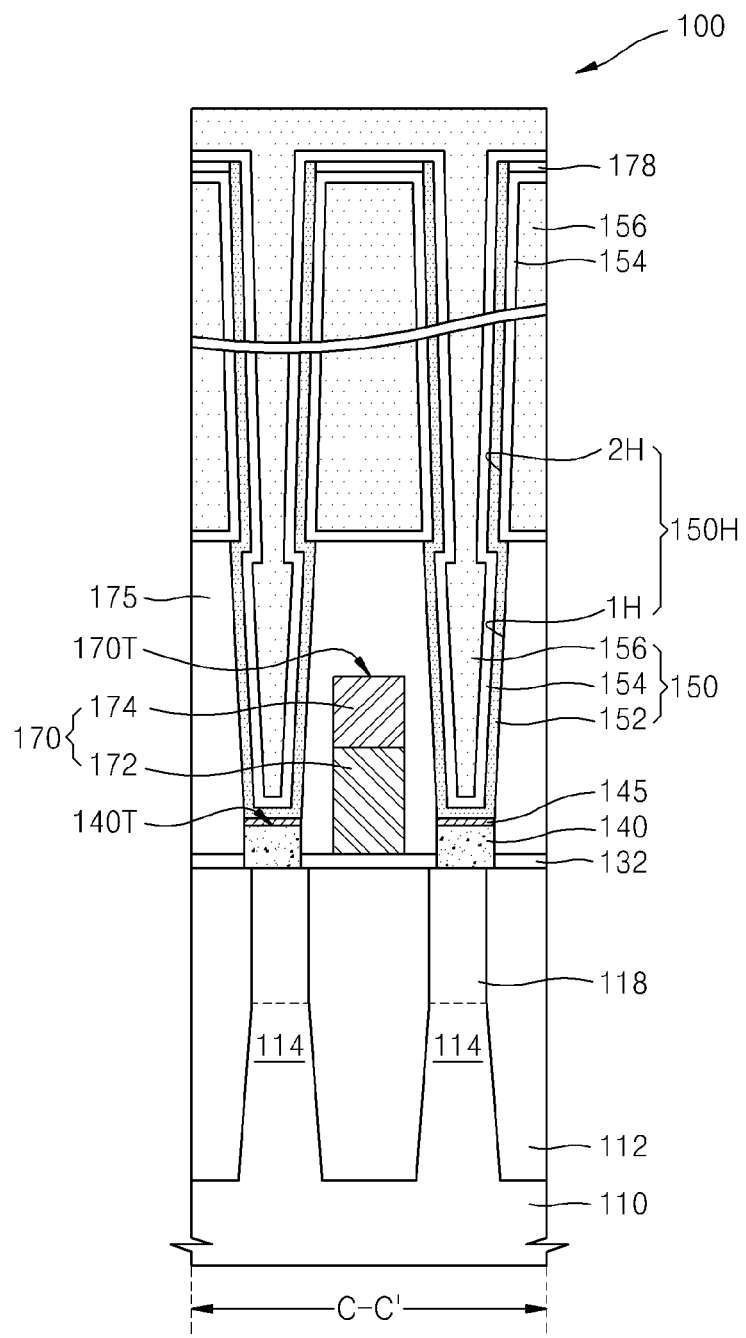

FIGS. 2A through 2C are cross-sectional views of the semiconductor device 100 of FIG. 1. FIG. 1 is a cross-sectional view of the semiconductor device 100 taken along a line A-A' of FIG. 1. FIG. 2B is a cross-sectional view of the semiconductor device 100 taken along a line B-B' of FIG. 1. FIG. 2C is a cross-sectional view of the semiconductor device 100 taken along a line C-C' of FIG. 1.

Referring to FIGS. 2A through 2C, the semiconductor device 100 includes a device isolation layer 112 that defines a plurality of active regions 114 in a substrate 110. The substrate 110 may include a semiconductor substrate, for example, formed of silicon, silicon-germanium, or the like. The substrate 110 may include an epitaxial layer, a silicon on insulator (SOI) layer, a semiconductor on insulator (SeOI) layer, or the like. The device isolation layer 112 may be formed of an insulating material. The device isolation layer 112 may be formed using a shallow trench isolation (STI) process. The device isolation layer 112 may be formed of, for example, oxide, nitride, or a combination thereof.

A plurality of buried word lines 126 may extend in a first direction of the substrate 110, for example, the y-axis direction of FIG. 1. The buried word lines 126 may be formed in trenches 120T and may each have an upper surface at a lower layer level than an upper surface 114T of the active region 114. The buried word lines 126 may be formed of metal, metal nitride, or doped polysilicon. In other embodiments, the buried word lines 126 are formed of TiN. Capping layers 130 may cover upper surfaces of the buried word lines 126. The capping layers 130 may be formed of, for example, silicon nitride. Gate insulating layers 124 may be formed between the buried word lines 136 and the active regions 114. The gate insulating layers 124 may be formed of oxide, nitride, or oxynitride. The gate insulating layer 124 may include, for example, a silicon oxide layer or an insulating layer having a high dielectric constant.

According to an embodiment, the buried word lines 126 are configured as a buried channel array transistor (BCAT). However, the inventive concept is not limited thereto. According to another embodiment of the inventive concept, a word line may be formed on the substrate 110 and may extend in a same direction.

Impurity regions 118 functioning as source/drain regions may be formed in the active regions 114. The impurity regions 118 may extend through the substrate 110 from the upper surfaces 114T of the active regions 114 to a predetermined depth in the substrate.

A plurality of bit lines 170 may be arranged on the buried word lines 126 to extend in a second direction, e.g., the x-axis direction shown in FIG. 1, perpendicular to the first direction, the y-axis direction shown in FIG. 1. The bit lines 170 may each have a structure formed by sequentially stacking a lower bit line 172 and an upper bit line 174 that are formed of different materials. However, the inventive concept is not limited thereto.

The semiconductor device 100 may be configured so that two buried word lines 126 may extend in parallel to each other in the first direction, for example, the y-direction shown in FIG. 1, in each active region 114 in the substrate 110. A direct contact 160 may be formed between the two buried word lines 126 that extend in every active region 114. Direct contacts 160 may be formed through the lower bit lines 172 of the bit lines 170. The direct contacts 160 are electrically connected to the impurity regions 118 in the active regions 114. The bit lines 170 may be electrically connected to the impurity regions 118 through the direct contacts 160.

Capacitors 150 may be formed on two external end portions of the two buried word lines 126 that cross the two active regions 114. Lower electrodes 152 of the capacitors 150 may each be integrally formed and may be formed in capacitor holes 150H including first holes 1H and second holes 2H. The lower electrodes 152 of the capacitors 150 may be electrically connected to the impurity regions 118 formed in the active regions 114 through epitaxial layers 140 and ohmic contact layers 145. The capacitors 150 may further include dielectric layers 154 formed on the lower electrodes 152, and upper electrodes 156 formed on the dielectric layers 154. The dielectric layers 154 and the upper electrodes 156 may each be formed on a single lateral surface of the lower electrode 152 in the first hole 1H and may each be formed on both lateral surfaces of the lower electrode 152 in the second hole 2H. The upper electrodes 156 may be formed to fill and cover the capacitor holes 150H and spaces between adjacent capacitors 150, and can electrically connect the drain regions and the bit lines BL.

The epitaxial layers 140 may be formed between the active regions 114 and the lower electrodes 152. The epitaxial layers 140 may be, for example, a silicon epitaxial layer and may have a thickness of 50 Å to 600 Å. As shown in FIG. 2C, the epitaxial layers 140 may be formed to have upper surfaces 140T at a lower layer level than upper surfaces 170T of the bit lines 170 based on a lower surface of the substrate 110. The ohmic contact layers 145 may be formed on the epitaxial layers 140. The ohmic contact layers 145 may include metal silicide. The ohmic contact layers 145 may include a silicide material of at least one selected from the group consisting of cobalt (Co), nickel (Ni), hafnium (Hf), platinum (Pt), tungsten (W), TiN, and titanium (Ti).

According to an embodiment, in the semiconductor device 100, the lower electrodes 152 of the capacitors 150 may be connected to the active regions 114 without a separate contact plug, thereby reducing a connection resistance. An area of the lower electrodes 152 is increased, thereby increasing a capacity, e.g., a charge storage capacity, of the capacitors 150. In addition, the epitaxial layers 140 are formed between the lower electrodes 152 and the active regions 114 with few defects, thereby preventing degradation in the characteristics of the semiconductor device 100 due to a leakage current at a contact interface.

FIGS. 3 through 11 are cross-sectional views describing a method of manufacturing a semiconductor device, according to an embodiment of the inventive concept.

The manufacturing method according to the present embodiment may include forming the capacitors 150 and the epitaxial layers 140 shown in FIGS. 2A through 2C. FIGS. 3 through 11 show corresponding portions taken along a line C-C' of FIG. 1.

Figure 3:
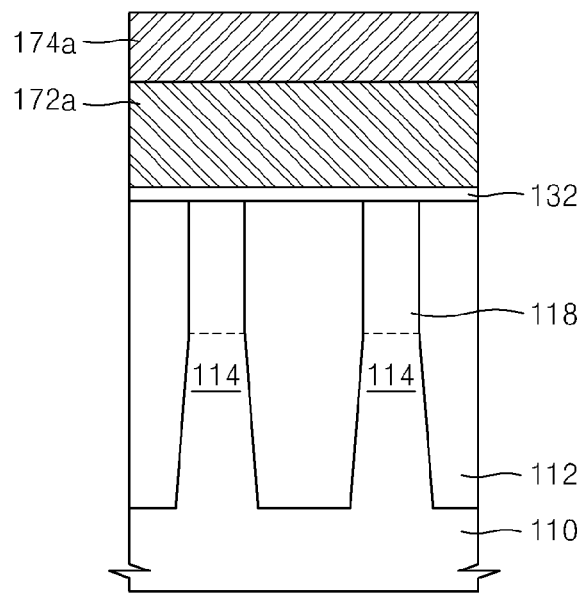
FIGS. 3 through 11 are cross-sectional views for describing a method of manufacturing a semiconductor device, according to an embodiment of the inventive concepts.

Referring to FIG. 3, an insulating layer 132 is formed on an upper surface of the substrate 110. A plurality of active regions 114 are defined in the substrate 110 by the device isolation layer 112. The insulating layer 132 may be formed of silicon nitride. If desired, the insulating layer 132 may be used as a gate insulating layer of a transistor (not shown) that is formed in a region, for example, a core region (not shown) or a peripheral circuit region (not shown) of the semiconductor device 100 (refer to FIG. 1).

The active regions 114 may include impurity regions 118 that are formed by injecting impurities thereto. The impurity regions 118 may serve as source and/or drain regions. When the buried word lines 126 of FIG. 2A constitute an NMOS transistor, an N-type impurity source such as $PH_3$, $AsH_3$, or the like may be used during an ion injection process for forming the impurity regions 118. In addition, when the buried word lines 126 constitute a PMOS transistor, a P-type impurity source such as $BF_3$, $BCl_3$, or the like may be used during an ion injection process for forming the impurity regions 118.

A lower conductive layer 172a and an upper conductive layer 174a that are used to form the bit lines 170 are sequentially formed on the insulating layer 132. The lower conductive layer 172a may include a conductive poly silicon layer. Prior to forming the upper conductive layer 174a, the direct contacts 160 of FIG. 2A may be formed through the lower conductive layer 172a. The upper conductive layer 174a may include metal, for example, tungsten (W).

Although not illustrated, prior to forming the lower conductive layer 172a and the upper conductive layer 174a, word lines may be formed in the substrate 110. When the word lines are the buried word lines 126 of FIG. 2A, the trenches 120T may be formed in the substrate 110. The gate insulating layers 124 and the buried word lines 126 may be sequentially formed in the trenches 120T. The capping layer 130 may be formed on the buried word lines 126 to fill and cover the trenches 120T.

Figure 4:
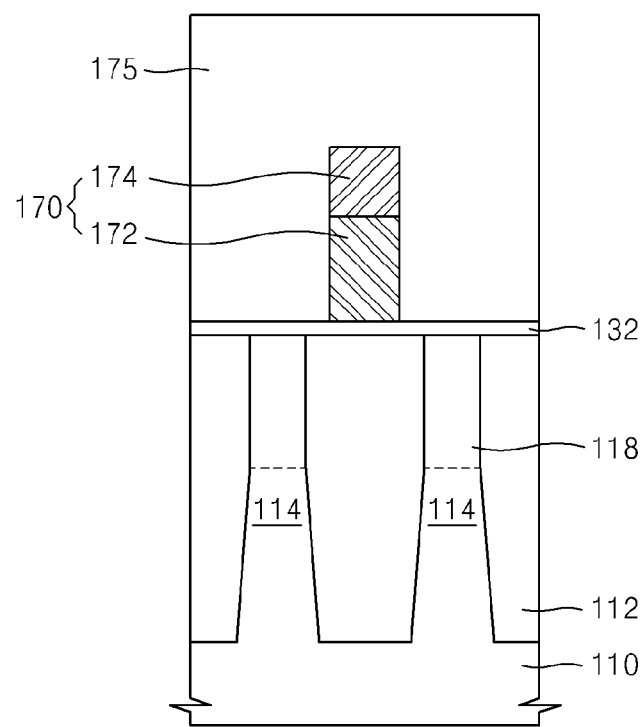

Referring to FIG. 4, the bit lines 170 may be formed by forming a mask pattern (not shown) on the upper conductive layer 174a and etching the upper conductive layer 174a and the lower conductive layer 172a by using the mask pattern as an etching mask. The bit lines 170 may each include the upper bit line 174 and the lower bit line 172 and may have a layout as described with reference to FIG. 1.

Then, interlayer insulating layers 175 may at least partially fill and cover spaces between the bit lines 170. The interlayer insulating layers 175 may include silicon oxide. In addition, the interlayer insulating layers 175 may include at least one selected from the group consisting of a boron-phosphorus silicate glass (BPSG) layer, an undoped silicate glass (USG) layer, a tetraethyl orthosilicate (TEOS) layer, and a high density plasma (HDP) layer.

Figure 5:
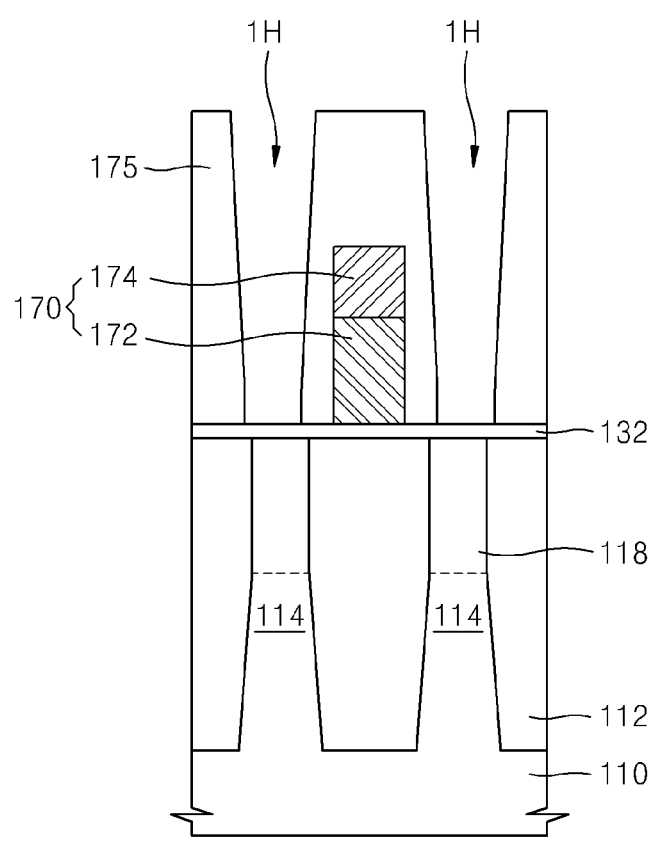

Referring to FIG. 5, a plurality of first holes 1H are formed at regions of the interlayer insulating layers 175 corresponding to the impurity regions 118 by forming a etching mask pattern (not shown) on the interlayer insulating layers 175 and then etching the interlayer insulating layers 175 by using the etching mask pattern as an etch mask. The first holes 1H may be formed to correspond to the capacitors CAPs of FIG. 1 and may be spaced apart from the bit lines 170 to prevent short circuits from occurring between the capacitors CAPs and the bit lines 170.

According to the present embodiment, the first holes 1H are not aligned with the active regions, and can be offset with respect to the active regions 114 by a predetermined length that is measured in an outwards direction of the bit lines 170. That is, each of the first holes 1H may be formed across a boundary between the active regions 114 and the device isolation layer 112. At least a portion of a lower surface of the first hole 1H may be positioned above the active region 114. The other portion of the lower surface of the first hole 1H may be positioned above the device isolation layer 112. According to another embodiment of the inventive concepts, the first hole 1H may be formed at a location corresponding to the active region 114 only, wherein none of the first hole 1H is positioned above the device isolation layer 112.

The insulating layer 132 may be used as an etch stop layer. According to another embodiment of the inventive concept, portions of the insulating layer 132, which are exposed by the first holes 1H, may be removed.

Figure 6:
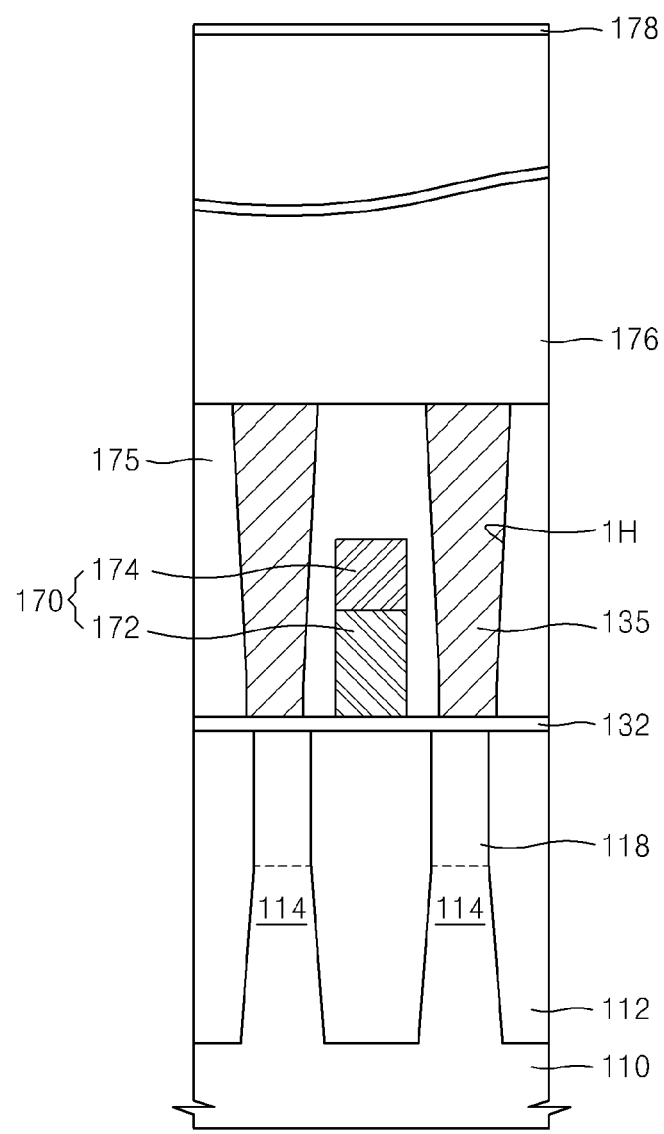

Referring to FIG. 6, dummy contact layers 135 are formed to fill the first holes 1H. A mold layer 176 may be formed to a predetermined thickness on the interlayer insulating layers 175 and the dummy contact layers 135.

The dummy contact layers 135 may have a material having an etch selectivity with respect to the interlayer insulating layers 175 and the mold layer 176. For example, when the interlayer insulating layers 175 and the mold layer 176 include oxide, the dummy contact layers 135 may include polysilicon. An etch prevention layer (not shown) may be further formed between the dummy contact layers 135 and the mold layer 176 and between the interlayer insulating layers 175 and the mold layer 176.

The mold layer 176 may include oxide. A support layer 178 for supporting a lower capacitor electrode 152 (refer to FIG. 11 may be formed on the mold layer 176) in a subsequent process, described below with reference to FIG. 11. The support layer 178 may include a material having an etch selectivity with respect to the mold layer 176. For example, when the mold layer 176 is formed of any one of $SiO_2$, SiGe, Si, and a carbon-based material, the support layer 178 may be formed of any one of SiN, SiCN, TaO, and $TiO_2$. Although not illustrated, the support layer 178 may be patterned in a manner such that the support layer 178 not to be formed on a predetermined region. According to another embodiment of the inventive concept, the support layer 178 may be formed in a mid-region of the mold layer 176, but not on the mold layer 176, or alternatively, the support layer 178 may be partially or completely omitted.

According to another embodiment of the inventive concept, when the insulating layer 132 is not formed in the previous processes, the insulating layer 132 may be formed prior to forming the dummy contact layers 135, in the current process. In this case, the insulating layer 132 may serve as an etch stop layer and/or a protective layer when the dummy contact layers 135 are removed (refer to FIG. 8) in a subsequent process.

Figure 7:
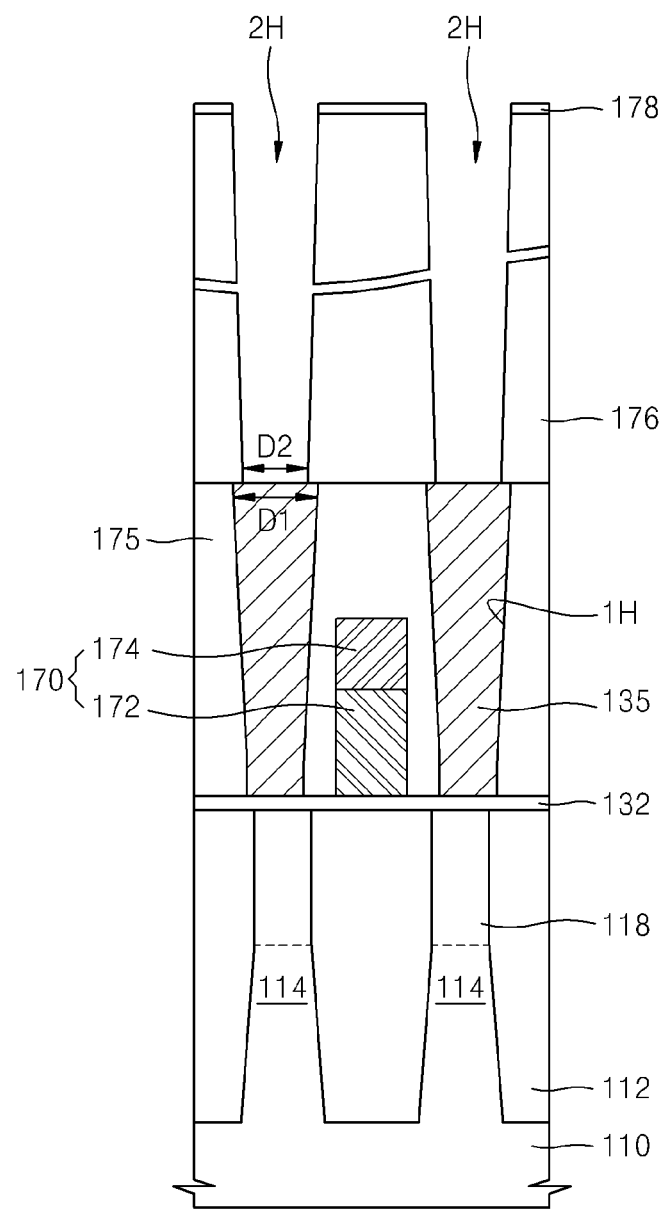

Referring to FIG. 7, second holes 2H are formed by etching the support layer 178 and the mold layer 176 to expose upper portions of the dummy contact layers 135. At an interface between the interlayer insulating layer 175 and the mold layer 176, the first holes 1H may each have a first width D1 and the second holes 2H may each have a second width D2 smaller than the first width D1. Thus, the second holes 2H may be formed to correspond to the first holes 1H only so that unacceptable etching is prevented with respect to lateral portions of the first holes 1H.

The mold layer 176 may be formed to a relatively great thickness and thus the second holes 2H may each have a great aspect ratio. Thus, the mold layer 176 may be etched by using, for example, a reactive ion etching (RIE) method.

Figure 8:
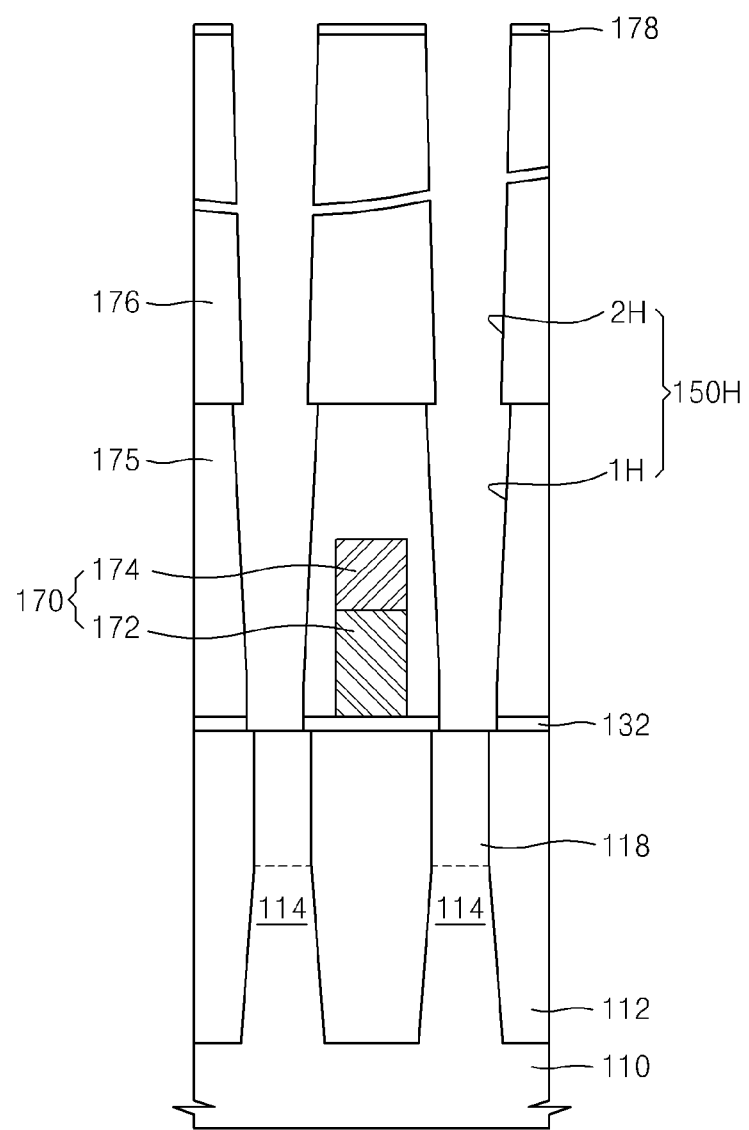

Referring to FIG. 8, the dummy contact layers 135 are removed from the second holes 2H. When the dummy contact layers 135 are formed of polysilicon, the dummy contact layers 135 may be removed using a wet etching process using a solution such as $NH_4OH$, KOH, $NH_2OH$, tetramethylammonium hydroxide (TMAH), or the like, or alternatively, may be removed by a dry etching process using plasma. By removing the dummy contact layers 135, lateral surfaces of the interlayer insulating layer 175 and the insulating layer 132 may be exposed.

The insulating layer 132 may prevent the active regions 114 from being damaged when the dummy contact layers 135 are removed. After the dummy contact layers 135 are removed, portions of the insulating layer 132, which are exposed by the first holes 1H, may be removed.

In the current process, capacitor holes 150H may be formed by connecting the first holes 1H and the second holes 2H. In other words, the capacitor holes 150H may continuously extend from the support layer 178 through the interlayer insulating layer 175 and the mold layer 176, to the impurity regions 118. The capacitor holes 150H may include bent portions that are formed due to a difference in widths of the first holes 1H and the second holes 2H at an interface between the interlayer insulating layer 175 and the mold layer 176. For example, a sidewall of the first hole 1H can be different than a sidewall of the second hole 2H.

In the current process, the dummy contact layers 135 including a material having an etch selectivity with respect to the interlayer insulating layer 175 and the mold layer 176, respectively, are used to form the capacitor holes 150H with a preferably high aspect ratio.

Figure 9:
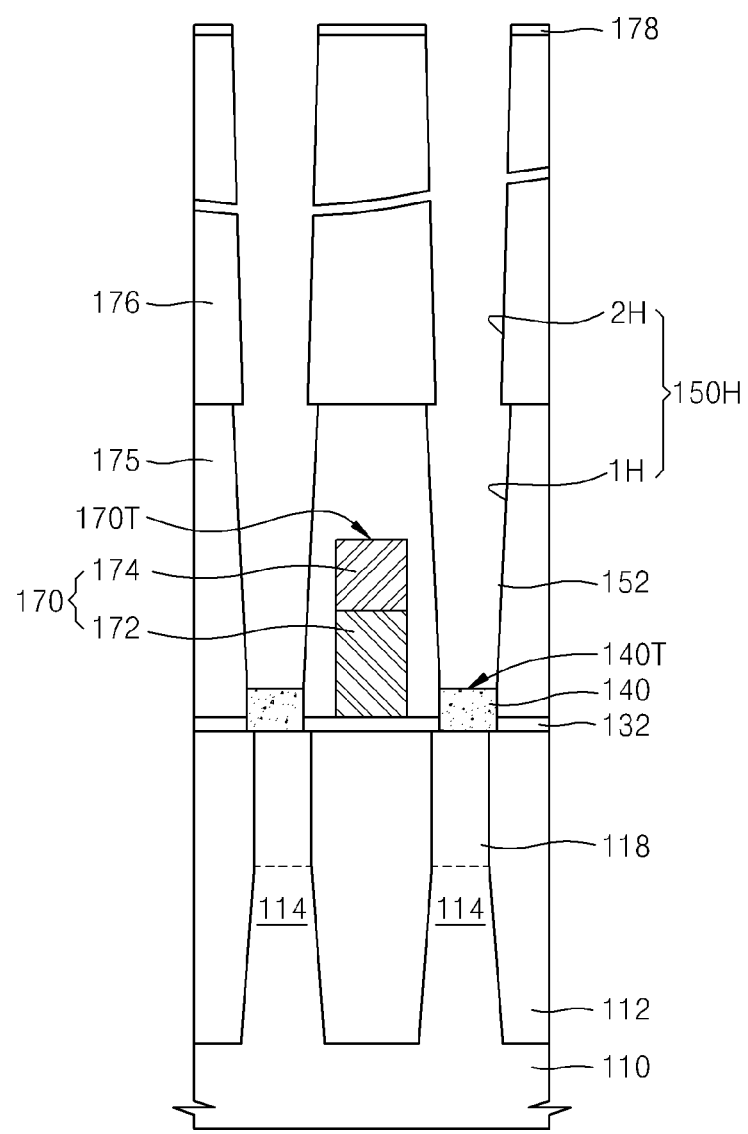

Referring to FIG. 9, the epitaxial layers 140 are formed on the active regions 114 in the capacitor holes 150H. The epitaxial layers 140 may be formed by a sequential epitaxial growth (SEG) method. Alternatively, the epitaxial layers 140 may be grown after a separate seed layer is formed.

The epitaxial layers 140 may be silicon epitaxial layers and may be formed to a thickness of 50 Å to 600 Å. When the epitaxial layers 140 are relatively thick, the capacitors 150 (refer to FIG. 2C) that are to be formed in a subsequent process may have relatively small electrostatic capacity and great connection resistance. When the epitaxial layers 140 are relatively thin, the epitaxial layers 140 do not have uniform thicknesses in a single semiconductor device, which may affect the characteristic of the semiconductor device. The upper surfaces 140T of the epitaxial layers 140 may be formed at a lower layer level than the upper surfaces 170T of the bit lines 170.

Selectively, prior to growing the epitaxial layers 140, a cleaning process may be performed. The cleaning process may include a dry cleaning process using gas such as HF, $NH_3$, or the like. Alternatively, the cleaning process may be a wet cleaning process using HF. The portions the insulating layer 132, which are exposed by the first holes 1H in FIG. 8, may be removed in the cleaning process.

Figure 10:
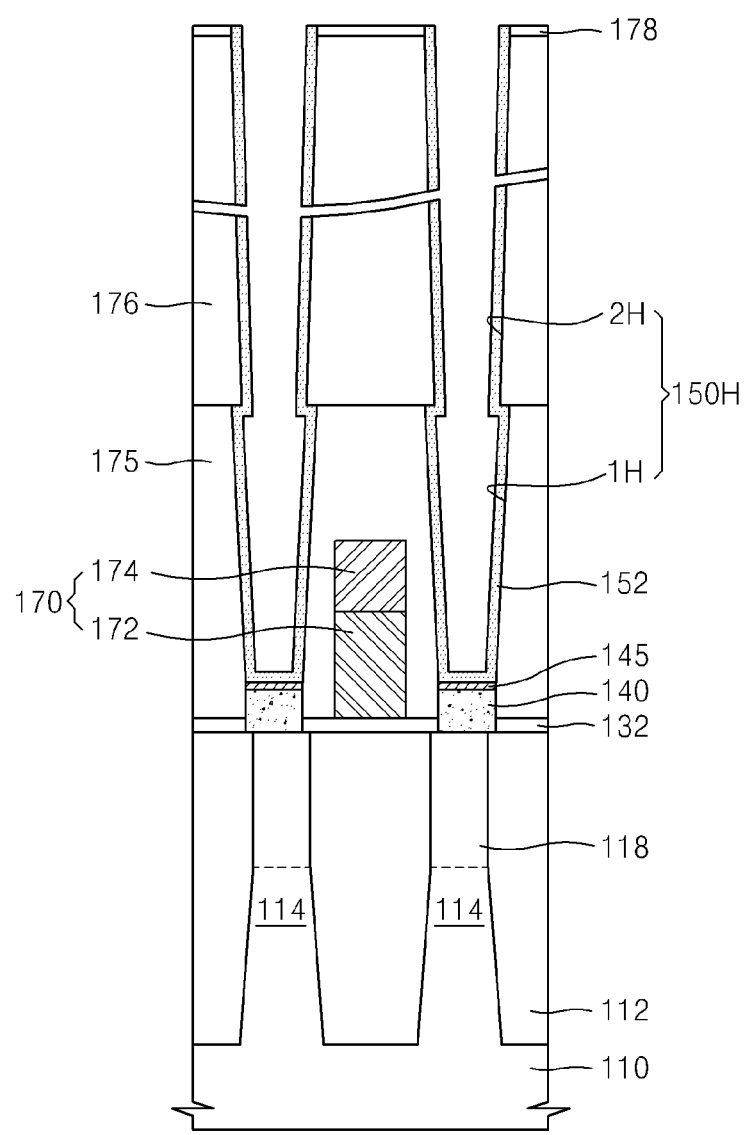

Referring to FIG. 10, the ohmic contact layers 145 may be formed on the epitaxial layers 140. The forming process of the ohmic contact layers 145 is selectively performed. According to another embodiment, the forming process may be omitted. The ohmic contact layers 145 may include metal silicide and may include a silicide material of at least one selected from the group consisting of cobalt (Co), nickel (Ni), hafnium (Hf), platinum (Pt), tungsten (W), TiN, and titanium (Ti). The ohmic contact layers 145 may be formed to a thickness of, for example, 100 Å to 200 Å.

Then, lower electrodes 152 may be formed in the capacitor holes 150H. The lower electrodes 152 may be formed of, for example, polysilicon, titanium nitride (TiN), tungsten (W), titanium (Ti), ruthenium (Ru), tungsten nitride (WN), or the like.

Then, the lower electrodes 152 may be separated from each other by removing portions of the lower electrodes 152 formed on the support layer 178. This process may be performed using an etch back process.

In the current process, the lower electrodes 152 constituting the capacitors 150 (refer to FIG. 2C) may extend towards the substrate 110 in the interlayer insulating layer 175, thereby increasing electrostatic capacity. In addition, since the epitaxial layers 140 are formed between the ohmic contact layers 145 and the active regions 114, even if the ohmic contact layers 145 have defects such as crystalline defects, a leakage current may be minimized. In addition, improved refresh characteristics may be obtained in a DRAM transistor or the like.

Figure 11:
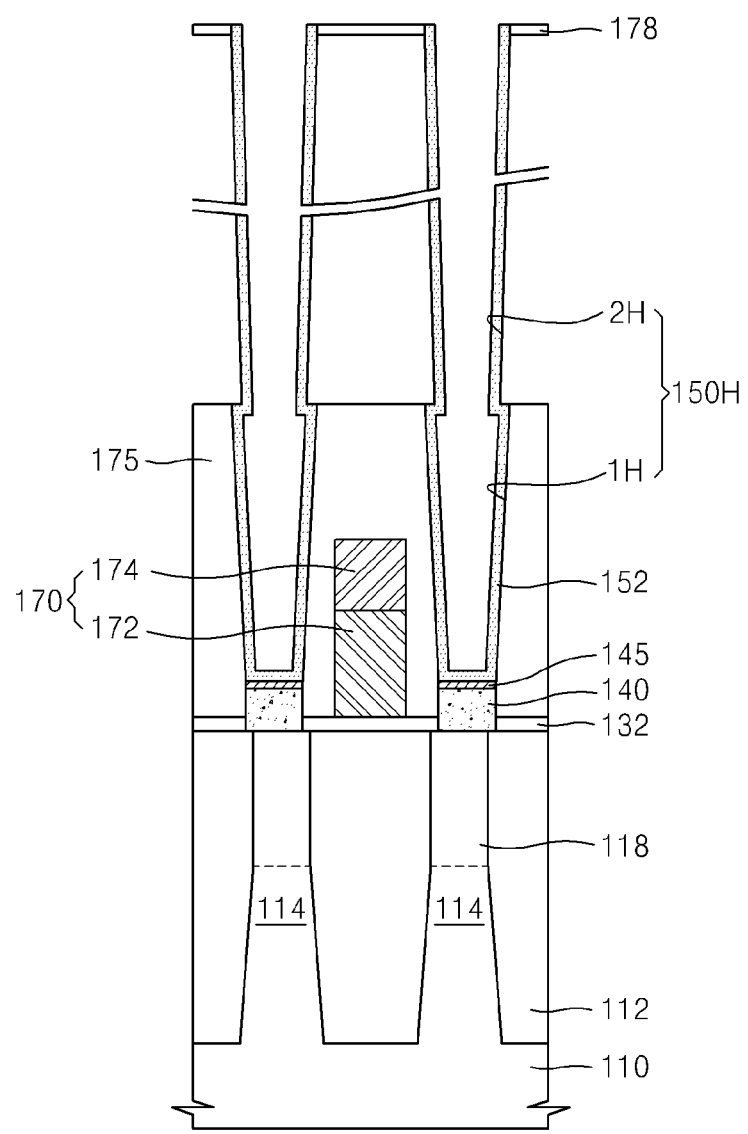

Referring to FIG. 11, the mold layer 176 may be removed. The mold layer 176 may be removed by a wet etching process or related process known to those of ordinary skill in the art. For example, the mold layer 176 may be removed using a lift-off process using, for example, a solution including $NH_4F$ and HF. When the mold layer 176 is removed, the lower electrodes 152 may be supported by the support layer 178 to prevent the structure including the lower electrodes from collapsing or otherwise changing the configuration of the capacitor holes 150H.

Then, with reference to FIGS. 2C and 11, the capacitors 150 may be formed by sequentially forming the dielectric layers 154 and the upper electrodes 156 on lateral surfaces of the lower electrodes 152. The dielectric layers 154 may include any one of a material with a high dielectric constant, such as $ZrO_2$, $Al_2O_3$, and $Hf_2O_3$. The dielectric layers 154 may include a composite layer including at least two layers including the material with a high dielectric constant. The upper electrodes 156 may include, for example, any one of doped polysilicon, titanium nitride (TiN), tungsten (W), titanium (Ti), ruthenium (Ru), and tungsten nitride (WN).

Thus, the dielectric layers 154 and the upper electrodes 156 may be formed on internal lateral surfaces of the lower electrodes 152 only in the first holes 1H in the interlayer insulating layer 175. Alternatively, the dielectric layers 154 and the upper electrodes 156 may be formed on both internal and external lateral surfaces of the lower electrodes 152 in the second holes 2H.

Figure 12:
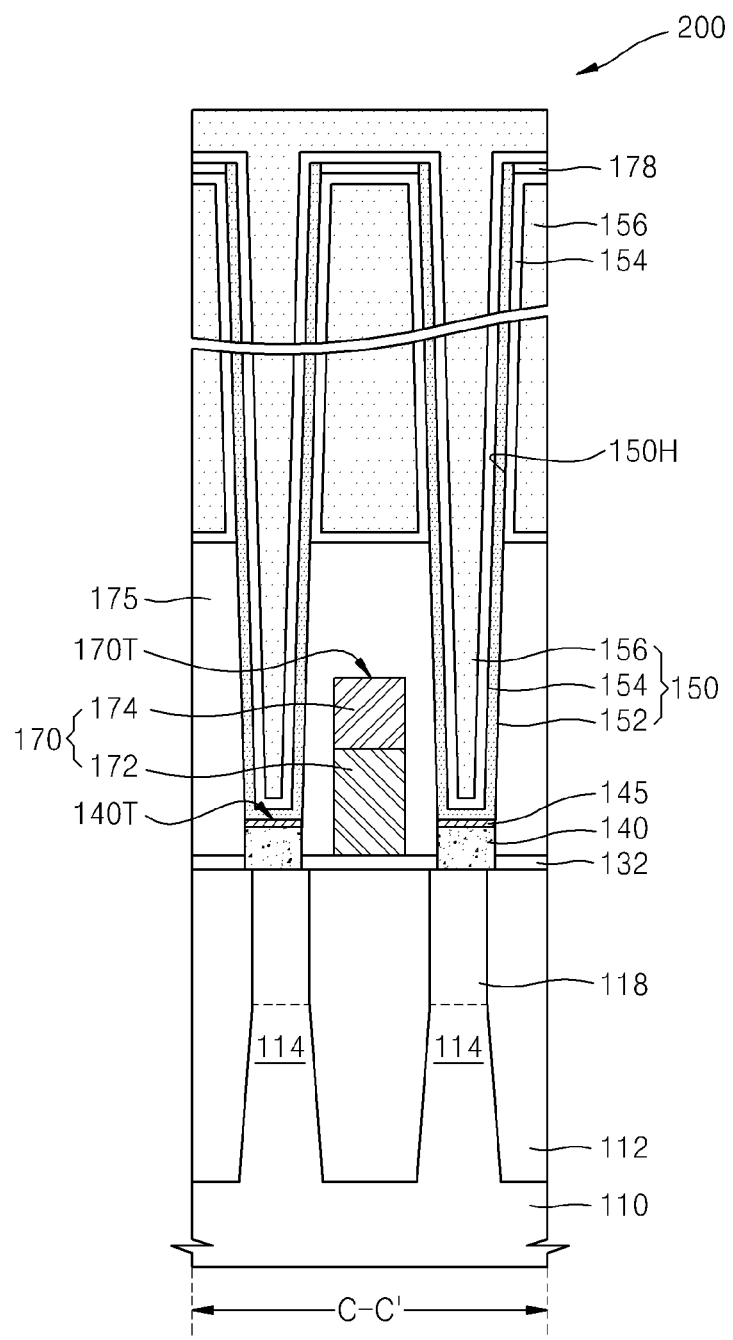
FIG. 12 is a cross-sectional view of a semiconductor device according to another embodiment of the inventive concepts.

FIG. 12 is a cross-sectional view of a semiconductor device 200 according to another embodiment of inventive concept. In FIG. 12, like reference numerals in FIGS. 1 through 2C denote like elements, and thus their description will be omitted, for convenience of description.

Referring to FIG. 12, the semiconductor device 200 may have the same layout as the semiconductor device 100 of FIG. 1. FIG. 12 is a cross-sectional view of a semiconductor device 200 taken along a line C-C' of FIG. 1. Unlike in FIG. 2C, in the semiconductor device 200, a width of each of the capacitor holes 150H is not changed at an interface between the interlayer insulating layer 175 and the upper electrode 156 so that each of the capacitor holes 150H is formed as a single hole.

The lower electrodes 152 of the capacitors 150 may be electrically connected to the impurity regions 118 in the active regions 114 through the epitaxial layers 140 and the ohmic contact layers 145. The capacitors 150 may further include the dielectric layers 154, which are formed on the lower electrodes 152, and the upper electrodes 156. In particular, the dielectric layers 154 and the upper electrodes 156 may be formed on internal lateral surfaces of the lower electrodes 152 only in the interlayer insulating layer 175 and may be formed on both internal and external surfaces of the lower electrodes 152 above the interlayer insulating layer 175. The upper electrodes 156 may be formed to at least partially fill and cover the capacitor holes 150H and spaces between adjacent capacitors 150.

The epitaxial layers 140 may be formed between the active regions 114 and the lower electrodes 152. The epitaxial layers 140 may be, for example, silicon epitaxial layers and may be formed to a thickness of, for example, 50 Å to 600 Å. The upper surfaces 140T of the epitaxial layers 140 may be at a lower layer level than the upper surfaces 170T of the bit lines 170, based on a lower surface of the substrate 110, as shown in FIG. 12. The ohmic contact layers 145 may be formed on the epitaxial layers 140. The ohmic contact layers 145 may include metal silicide and may include a silicide material of at least one selected from the group consisting of cobalt (Co), nickel (Ni), hafnium (Hf), platinum (Pt), tungsten (W), TiN, and titanium (Ti).

According to the present embodiment, in the semiconductor device 200, the lower electrodes 152 of the capacitors 150 may be connected to the active regions 114 without a separate contact plug, thereby reducing a connection resistance. An area of the lower electrodes 152 is increased, thereby increasing a capacity of the capacitors 150. In addition, the epitaxial layers 140 with few defects are formed between the lower electrodes 152 and the active regions 114, thereby preventing degradation in the characteristics of the semiconductor device 200 due to a leakage current at a contact interface.

Figure 13:
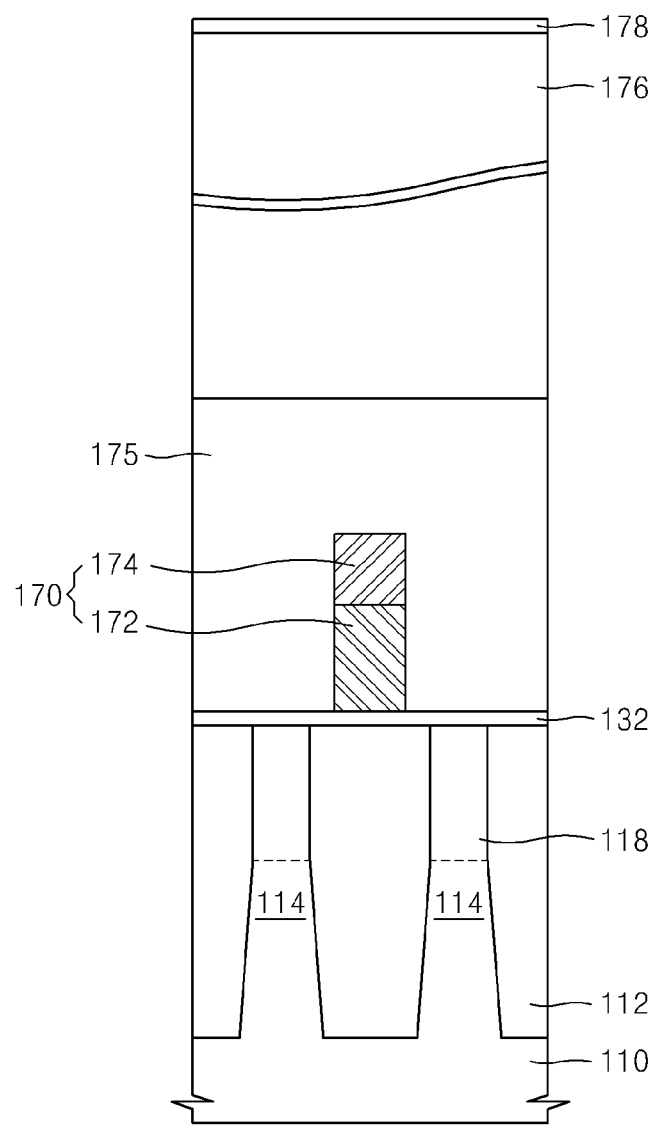
FIGS. 13 and 14 are cross-sectional views for describing a method of manufacturing a semiconductor device, according to another embodiment of the inventive concepts.
Figure 14:
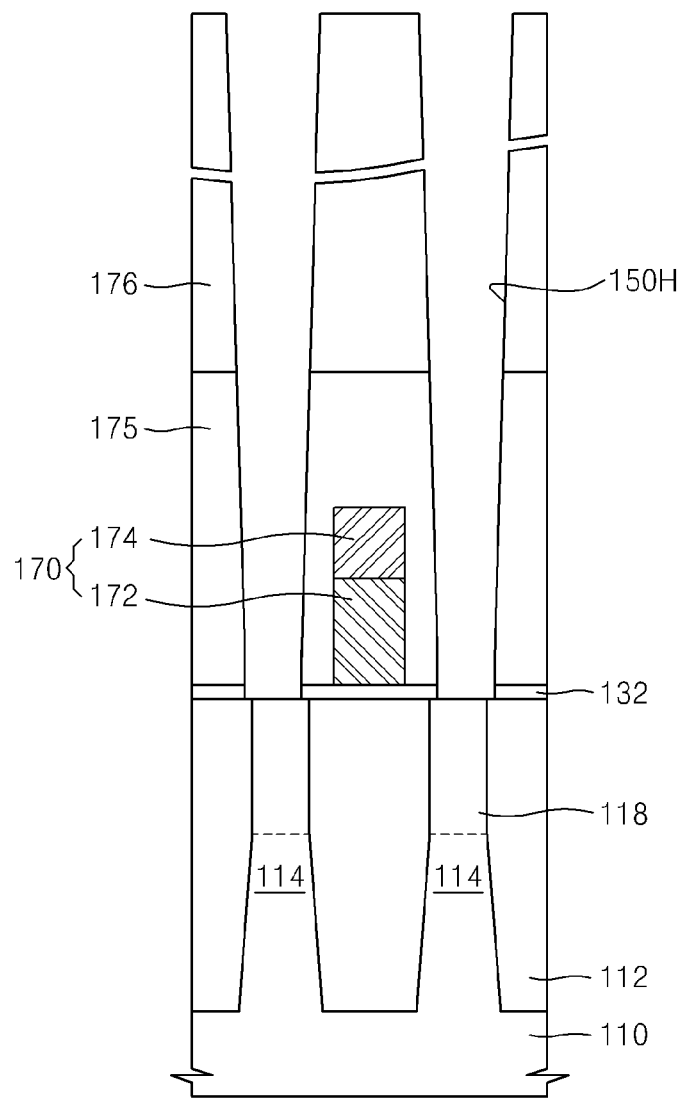

FIGS. 13 and 14 are cross-sectional views for explaining a method of manufacturing a semiconductor device, according to another embodiment of the inventive concept.

The manufacturing method according to the present embodiment may include a method the same as or similar to the method of manufacturing the semiconductor device 200 of FIG. 12.

Referring to FIG. 13, the processes described with reference to FIGS. 3 and 4 may be performed. The mold layer 176 may be formed on the interlayer insulating layer 175. The mold layer 176 may include oxide. The support layer 178 may be formed on the mold layer 176. The support layer 178 may be formed of a material having an etch selectivity with respect to the mold layer 176. Although not illustrated, the support layer 178 may be patterned so as to not be formed on a predetermined region. In another embodiment, the support layer 178 is formed in the middle of the mold layer 176, but not on the mold layer 176.

Referring to FIG. 14, the capacitor holes 150H are formed by etching the interlayer insulating layer 175 and the mold layer 176. This etching process may include a single step or two steps according to materials of the interlayer insulating layer 175. This etching process may be performed using a reactive ion etching (RIE) method. Thus, the capacitor holes 150H may each be integrally formed.

According to another embodiment, when the interlayer insulating layer 175 and the mold layer 176 have different etching characteristics, the capacitor holes 150H may have bent portions that are formed due to a difference in widths of the capacitor holes 150H in the interlayer insulating layer 175 and the mold layer 176 at an interface therebetween.

According to the present embodiment, the capacitor holes 150H that are connected to the substrate 110 may be formed by a single process, thereby simplifying a manufacturing method.

Then, the processes described with reference to FIGS. 9 through 11 may be performed to form the semiconductor device 200 of FIG. 12. That is, the epitaxial layers 140 may be formed on the active regions 114 in the capacitor holes 150H. Then, the ohmic contact layers 145 may be formed on the epitaxial layers 140. Then, the lower electrodes 152 may be separated from each other by forming the lower electrodes 152 in the capacitor holes 150H and removing portions of the lower electrodes 152 formed on the support layer 178. Then, the mold layer 176 may be removed. The capacitors 150 may be formed by sequentially forming the dielectric layers 154 and the upper electrodes 156 on lateral surfaces of the lower electrodes 152.

Figure 15:
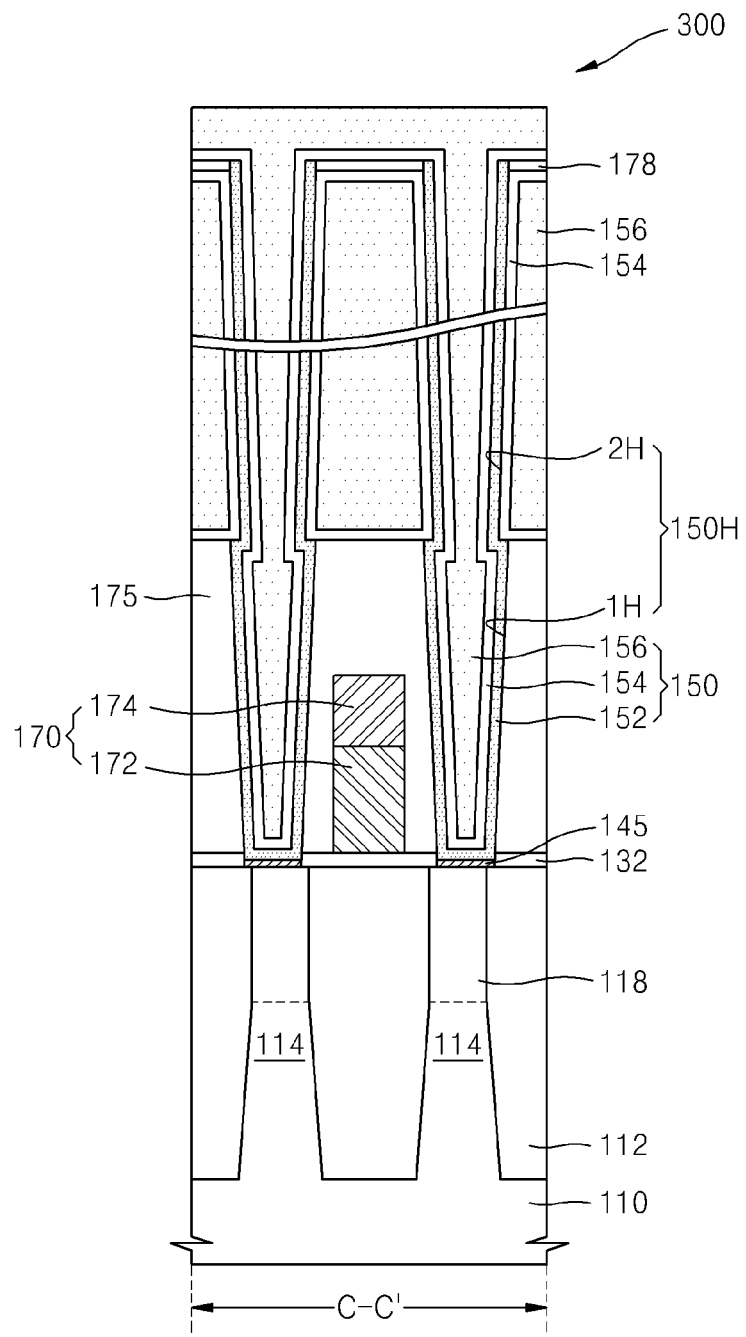
FIG. 15 is a cross-sectional view of a semiconductor device according to another embodiment of the inventive concepts.

FIG. 15 is a cross-sectional view of a semiconductor device 300 according to another embodiment of inventive concept. In FIG. 15, like reference numerals in FIGS. 1 through 2C denote like elements, and thus their description will be omitted, for convenience of description.

Referring to FIG. 15, the semiconductor device 300 may have the same layout as the semiconductor device 100 of FIG. 1. FIG. 15 is a cross-sectional view of a semiconductor device 300 taken along a line C-C of FIG. 1. Unlike in the semiconductor devices 100 and 200 of FIGS. 2C and 12, in the semiconductor device 300, the epitaxial layers 140 are not formed. Accordingly, ohmic contact layers 145 are positioned between the lower electrodes 152 and the impurity regions 118 of the active regions 114.

Each of the lower electrodes 152 of the capacitors 150 may be integrally formed and may be formed in each of the capacitor holes 150H including the first holes 1H and the second holes 2H. The lower electrodes 152 of the capacitors 150 may be electrically connected to the impurity regions 118 of the active regions 114 through the ohmic contact layers 145. The capacitors 50 may further include the dielectric layers 154, which are formed on the lower electrodes 152, and the upper electrodes 156. In particular, the dielectric layers 154 and the upper electrodes 156 may be formed on internal lateral surfaces of the lower electrodes 152 only in the first holes 1H and may be formed on both internal and external surfaces of the lower electrodes 152 in the second holes 2H. The upper electrodes 156 may be formed to at least partially fill and cover the capacitor holes 150H and spaces between adjacent capacitors 150.

The ohmic contact layers 145 may be formed between the active regions 114 and the lower electrodes 152. The ohmic contact layers 145 may include metal silicide and may include a silicide material of at least one selected from the group consisting of cobalt (Co), nickel (Ni), hafnium (Hf), platinum (Pt), tungsten (W), TiN, and titanium (Ti).

According to the present embodiment, in the semiconductor device 300, the lower electrodes 152 of the capacitors 150 may be connected to the active regions 114 without a separate contact plug, thereby reducing a connection resistance. In addition, an area of the lower electrodes 152 can be increased, thereby increasing a capacity of the capacitors 150.

While the inventive concepts have been particularly shown and described with reference to exemplary embodiments thereof, it will be understood that various changes in form and details may be made therein without departing from the spirit and scope of the following claims.

What is claimed is:

1. A method of manufacturing a semiconductor device, the method comprising:
   forming a bit line on a substrate comprising an active region;
   forming an interlayer insulating layer covering the bit line on the substrate;
   forming a first hole at a location of the active region through the interlayer insulating layer;
   forming a dummy contact layer by filling the first hole;
   forming a mold layer on the interlayer insulating layer and the dummy contact layer;
   forming a second hole at a location of the dummy contact layer through the mold layer;
   removing the dummy contact layer in the first hole through the second hole;
   forming an epitaxial layer on a portion of the active region, which is exposed at a lower surface of the first hole; and
   forming a lower electrode on internal surfaces of the first hole and the second hole.

2. The method of claim 1, wherein an upper surface of the epitaxial layer is formed at a layer that is at a lower level than an upper surface of the bit line.

3. The method of claim 1, wherein a lower surface of the lower electrode is formed at a layer that is at a lower level than an upper surface of the bit line.

4. The method of claim 1, wherein a width of the first hole is greater than a width of the second hole at an interface between the first hole and the second hole.

5. The method of claim 1, further comprising forming an ohmic contact layer comprising a silicide material on the epitaxial layer.

6. The method of claim 1, wherein the epitaxial layer is formed using sequential epitaxial growth (SEG).

7. The method of claim 1, wherein the epitaxial layer is a silicon epitaxial layer having a thickness of 50 Å to 600 Å.

8. The method of claim 1, further comprising, prior to the forming of the dummy contact layer, forming an etch stop layer on a portion of the active region, which is exposed by the first hole,
   wherein portions of the etch stop layer are removed after the dummy contact layer is removed.

9. The method of claim 1, wherein the dummy contact layer comprises polycrystalline silicon.

10. The method of claim 9, wherein the dummy contact layer is removed using a wet etching process using a solution comprising at least one of $NH_4OH$, $KOH$, $NH_2OH$, and tetramethylammonium hydroxide (TMAH).

11. The method of claim 1, further comprising:
    removing the mold layer; and
    forming a dielectric layer and an upper electrode on the lower electrode, wherein the dielectric layer and the upper electrode are formed on a single lateral surface of the lower electrode only in the first hole and are formed on both lateral surfaces of the lower electrode in the second hole.

12. The method of claim 1, further comprising forming a gate line that is buried in the substrate, crosses the active region, and extends in a direction perpendicular to the bit line.

13. A method of manufacturing a semiconductor device, the method comprising:
   forming a bit line on a substrate comprising an active region;
   forming an interlayer insulating layer on an upper surface of the bit line on the substrate;
   forming a first hole at a location of the active region through the interlayer insulating layer;
   forming a dummy contact layer by filling the first hole;
   forming a mold layer on the interlayer insulating layer and the dummy contact layer;
   forming a second hole at a location of the dummy contact layer through the mold layer;
   removing the dummy contact layer in the first hole through the second hole; and
   forming a lower electrode on internal surfaces of the first hole and second hole.

14. The method of claim 13, wherein the lower electrode comprises a bent portion that is formed due to a difference in widths of the first hole and second hole at an interface therebetween.

15. The method of claim 13, further comprising forming an epitaxial layer on a portion of the active region, wherein an upper surface of the epitaxial layer is formed at a layer that is at a lower level than the upper surface of the bit line.

16. A method of manufacturing a semiconductor device, comprising:
   forming an active region in a substrate;
   forming a bit line on the substrate having the active region;
   forming an interlayer insulating layer on the substrate;
   forming a capacitor hole in the interlayer insulating layer to the active region;
   forming at least one of an epitaxial layer and an ohmic contact layer in the capacitor hole on the active region; and
   forming an electrode on sidewalls of the capacitor hole and on the ohmic contact layer;
   wherein forming the capacitor hole includes:
      forming a first hole in the interlayer insulating layer to the active region;
      filling the first hole with a dummy contact layer;
      forming a mold layer on the interlayer insulating layer and the dummy contact layer;
      forming a second hole in the mold layer to the dummy contact layer; and
      removing the dummy contact layer in the first hole through the second hole.

17. The method of claim 16, wherein the lower electrode comprises a bent portion that is formed due to a difference in widths of the first hole and second hole at an interface therebetween.

18. The method of claim 16, wherein an upper surface of the epitaxial layer is formed at a layer that is at a lower level than an upper surface of the bit line.

19. The method of claim 16, wherein a lower surface of the lower electrode is formed at a layer that is at a lower level than an upper surface of the bit line.

* * * * *